(12) United States Patent
Hasegawa et al.

(10) Patent No.: US 11,293,966 B2
(45) Date of Patent: Apr. 5, 2022

(54) TEST APPARATUS FOR DETERMINING PASS OR FAIL OF LEDS, TEST METHOD AND COMPUTER-READABLE MEDIUM

(71) Applicant: ADVANTEST CORPORATION, Tokyo (JP)

(72) Inventors: Kotaro Hasegawa, Tokyo (JP); Kouji Miyauchi, Tokyo (JP); Go Utamaru, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 53 days.

(21) Appl. No.: 16/817,642

(22) Filed: Mar. 13, 2020

(65) Prior Publication Data

US 2020/0379029 A1    Dec. 3, 2020

(30) Foreign Application Priority Data

May 31, 2019 (JP) .............................. JP2019-103155

(51) Int. Cl.
*G01R 31/26*    (2020.01)
*G01R 31/28*    (2006.01)

(52) U.S. Cl.
CPC ..... *G01R 31/2635* (2013.01); *G01R 31/2887* (2013.01)

(58) Field of Classification Search
CPC .......... H01L 2933/0058; H01L 25/167; G01R 31/2635; G01R 31/2656; G01R 31/2601; G01R 31/2637; G01R 31/27; G01R 31/2887; G01R 31/308; G01R 31/311; G01R 33/0354; G06F 2203/04109; G06F 3/0421; G01J 1/08; G01J 1/4257; G01J 2001/4238; G01J 2001/4242;
(Continued)

(56) References Cited

U.S. PATENT DOCUMENTS 5,631,571 A * 5/1997 Spaziani ................ G01R 1/071
                                              324/658
5,990,692 A    11/1999 Jeong
(Continued)

FOREIGN PATENT DOCUMENTS

CN    1165401 A      11/1997
CN    101290340 A    10/2008
(Continued)

OTHER PUBLICATIONS

Office Action issued for counterpart Korean Application10-2020-0025876, issued by the Korean Intellectual Property Office dated Jan. 7, 2021.
(Continued)

*Primary Examiner* — Vinh P Nguyen

(57) ABSTRACT

A test apparatus includes an electrical connection unit electrically connected to respective terminal of each of a plurality of LEDs to be tested, a light source unit which collectively irradiates the plurality of LEDs with light, a measuring unit which measures a photoelectric signal that each of the plurality of LEDs outputs via the electrical connection unit after photoelectrically converting the light with which the light source unit irradiates the plurality of LEDs, and a determination unit which determines pass or fail of each of the plurality of LEDs based on the measurement results by the measuring unit.

14 Claims, 6 Drawing Sheets

(58) Field of Classification Search
CPC ....... G01J 2001/4252; G01J 2003/1217; G01J 2003/2826; G01J 3/0208; G01J 3/021; G01J 3/0216; G01J 3/0218; G01J 3/0251; G01J 3/10; G01J 3/2823; G01J 3/4412; G01J 3/51; G01J 5/0003; G01J 5/0007; G01L 1/12; G01L 21/12; G02F 1/01708; G02F 1/01791
See application file for complete search history.

(56) References Cited

U.S. PATENT DOCUMENTS

| | | | | |
|---|---|---|---|---|
| 6,678,623 | B2* | 1/2004 | Koyama | G01R 31/311 |
| | | | | 702/82 |
| 8,159,659 | B2* | 4/2012 | Osawa | G01M 11/0257 |
| | | | | 356/124 |
| 9,040,896 | B2* | 5/2015 | Walker | G01J 1/0451 |
| | | | | 250/208.2 |
| 9,404,962 | B2* | 8/2016 | Huang | G01R 31/2635 |
| 9,551,669 | B2* | 1/2017 | Morrow | G01N 21/8422 |
| 9,797,942 | B2* | 10/2017 | Engberg | G01J 5/522 |
| 2005/0194990 | A1 | 9/2005 | Gothoskar | |
| 2009/0236506 | A1* | 9/2009 | Dudgeon | G01J 1/42 |
| | | | | 250/228 |
| 2010/0053601 | A1 | 3/2010 | Osawa | |
| 2012/0194211 | A1 | 8/2012 | Osawa | |
| 2013/0229188 | A1 | 9/2013 | Seymour | |
| 2016/0306042 | A1 | 10/2016 | Schrank | |
| 2017/0208655 | A1 | 7/2017 | Lee | |
| 2018/0352619 | A1 | 12/2018 | Weber | |

FOREIGN PATENT DOCUMENTS

| | | |
|---|---|---|
| CN | 101583860 A | 11/2009 |
| CN | 102486520 A | 6/2012 |
| CN | 103364707 A | 10/2013 |
| CN | 205844396 U | 12/2016 |
| JP | S59230143 A | 12/1984 |
| JP | 2007528129 A | 10/2007 |
| JP | 2010230568 A | 10/2010 |
| JP | 2017504959 A | 2/2017 |
| JP | 2019507953 A | 3/2019 |
| KR | 20170085334 A | 7/2017 |
| TW | 200730845 A | 8/2007 |
| TW | 201500750 A | 1/2015 |
| WO | 2008059767 A1 | 5/2008 |

OTHER PUBLICATIONS

Office Action issued for counterpart Taiwanese Application 109107015, issued by the Taiwan Intellectual Property Office dated Aug. 27, 2020.

Office Action issued for counterpart Taiwanese Application 109107015, issued by the Taiwan Intellectual Property Office dated Nov. 30, 2020.

Notice of First Office Action for Patent Application No. 202010290804.5, issued by The National Intellectual Property Administration of the People's Republic of China dated Feb. 7, 2022.

* cited by examiner

TEST APPARATUS FOR DETERMINING PASS OR FAIL OF LEDS, TEST METHOD AND COMPUTER-READABLE MEDIUM The contents of the following Japanese patent applications are incorporated herein by reference:
NO. 2019-103155 filed in JP on May 31, 2019.

BACKGROUND

1. Technical Field

The present invention relates to a test apparatus, a test method, and a computer-readable medium.

2. Related Art

A method of inspecting optical properties of LEDs by causing one of a pair of LED to be inspected to emit light, which is received by the other, and using the value of the current output by the photoelectric effect is known (for example, see Patent documents 1, 2).

RELATED ART DOCUMENTS

Patent Documents

Patent document 1: Japanese Translation of PCT International Application Publication No. 2019-507953
Patent document 2: Japanese Patent Application Publication No. 2010-230568

However, in the above-mentioned method, the inspection needs to be performed by causing each LED to emit in turn, and the optical properties of a plurality of LEDs can not be inspected collectively.

GENERAL DISCLOSURE

In an aspect of the present invention, a test apparatus is provided. The test apparatus may include an electrical connection unit electrically connected to respective terminals of a plurality of LEDs to be tested. The test apparatus may include a light source unit which collectively irradiates the plurality of LEDs with light. The test apparatus may include a measuring unit which measures a photoelectric signal that each of the plurality of LEDs outputs via the electrical connection unit after photoelectrically converting the light with which the light source unit irradiates the plurality of LEDs. The test apparatus may include a determination unit which determines pass or fail of each of the plurality of LEDs based on the measurement results by the measuring unit.

The electrical connection unit may be arranged between the light source unit and the plurality of LEDs. The electrical connection unit may have substrate having an opening which allows the light from the light source unit to pass towards the plurality of LEDs. The electrical connection unit may have a plurality of probes extending from the substrate towards each of the plurality of LEDs exposed in the opening and contacting the terminals of each of the plurality of LEDs.

The test apparatus may further include a placement unit on which a LED group is placed. The electrical connection unit may switch sets of the plurality of LEDs in the LED group to which the electrical connection unit connects and are to be sequentially tested, by the placement unit moving with the LED group placed thereon. The measuring unit may measure the photoelectric signal from the set of the plurality of LEDs to which the electrical connection unit is sequentially connected.

The determination unit may determine at least one LED among the plurality of LEDs as fail if the measured photoelectric signal of the at least one LED is outside a normal range.

A range based on a statistic in accordance with the photoelectric signals output by the plurality of respective LEDs may be used as the normal range.

A range based on a statistic in accordance with the photoelectric signals output by LEDs of different sets that are arranged at a same position in measurement results from multiple measurements while changing the set of the plurality of LEDs to be sequentially tested among the LED group may be used as the normal range.

The light source unit may emit white light.

The light source unit may be able to switch between plural types of light with different color components.

The light source unit may have plural types of color filters, and may allow light to pass through each of the plural types of color filter to thereby emit each of the plural types of light.

The light source unit may have a plurality of light sources with different optical wavelengths. The light source unit may emit each of the plural types of light with different color components by switching between the plurality of light sources.

The test apparatus may further include a blocking unit which blocks light other than the light from the light source unit.

In an aspect of the present invention, a test method is provided. The test method may include electrically connecting an electrical connection unit to respective terminals of a plurality of LEDs to be tested. The test method may include collectively irradiating the plurality of LEDs with light. The test method may include measuring a photoelectric signal which each of the plurality of LEDs outputs via the electrical connection unit after photoelectrically converting the irradiated light. The test method may include determining pass or fail of each of the plurality of LEDs based on the measurement results from the measuring.

In an aspect of the present invention, a computer-readable medium having recorded thereon a program that, when executed by a test apparatus to test a plurality of LEDs, causes the test apparatus to execute the above-mentioned test method is provided.

The summary clause above does not necessarily describe all necessary features of the embodiments of the present invention. Further, the present invention may also be a sub-combination of the features described above.

DESCRIPTION OF EXEMPLARY EMBODIMENTS

Figure 1:
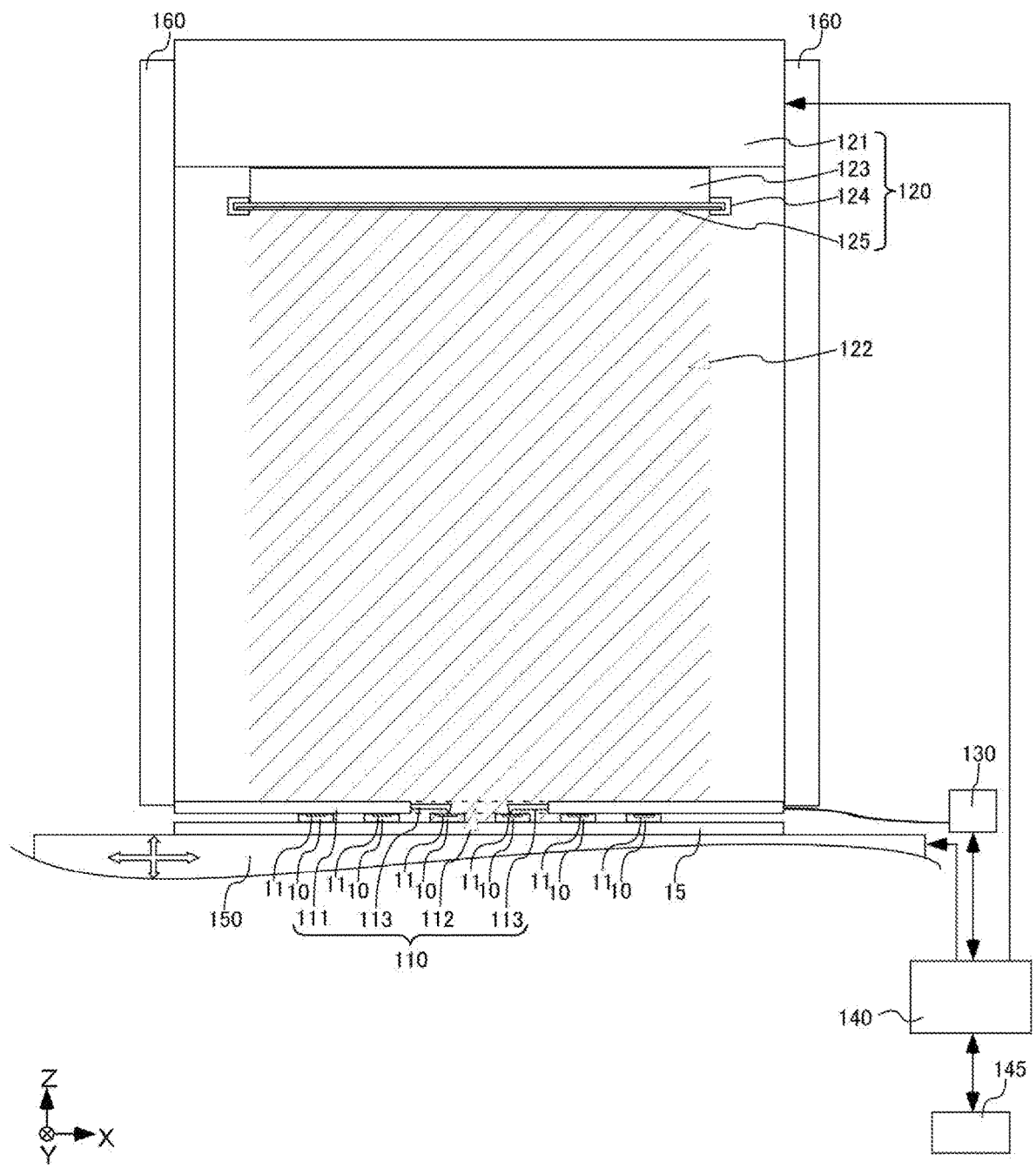
FIG. 1 is one example of a schematic overall view of a test apparatus 100 testing a plurality of LEDs 10.

Hereinafter, the present invention will be described through embodiments of the invention, but the following embodiments do not limit the invention according to the claims. In addition, not all combinations of features described in the embodiments are essential for the solution of the invention. Note that, in the drawings, identical or similar portions are given identical reference numerals, and repeated descriptions may be omitted.

FIG. 1 is one example of a schematic overall view of a test apparatus 100 testing a plurality of LEDs 10. In FIG. 1, an X-axis with the right-hand direction of the sheet of paper being the +X direction, a Z-axis with the upper direction of the sheet of paper being the +Z direction, and a Y axis with the depth direction of the sheet of paper being +Y direction are illustrated to be orthogonal against each other. Hereinafter, these three axes may be used in the descriptions.

The test apparatus 100 utilizes photoelectric effect of the LEDs 10 and collectively tests the optical properties of the plurality of LEDs 10 based on the photoelectric signal output from the LEDs 10 irradiated with light. The test apparatus 100 includes an electrical connection unit 110, a light source unit 120, a measuring unit 130, and a control unit 140. The test apparatus 100 of the present embodiment may further include a storage unit 145, a placement unit 150, and a blocking unit 160.

The test apparatus 100 of the present embodiment collectively tests the optical properties of certain sets of the plurality of LEDs 10 among a LED group, which is formed by the plurality of LEDs 10 on a wafer 15, for example, a bare silicon wafer without electrical wire provided thereon, with the LED group placed on the placement unit 150. The LEDs 10 of the present embodiment are micro LEDs having a dimension below 100 μm. It is noted that instead of micro LEDs, the LEDs 10 may be mini LEDs having a dimension larger than 100 μm and below 200 μm, or LEDs having a dimension larger than 200 μm.

In addition, the plurality of LEDs 10 of the present embodiment is not electrically connected to each other on the wafer 15, and emits monochromatic light. It is noted that the plurality of LEDs 10 is formed on a wafer provided with electrical wire or on a glass-based panel with a substantially rectangular outline (panel level packaging, PLP), and may be electrically connected to each other to form a unit or cell. In such cases, each color of RGB may be mixed, for example by techniques of the laser lift off and transfer from monochromatic wafer of each of RGB, or by techniques of dying or applying fluorescent coating over monochromatic wafer of any of RGB.

The electrical connection unit 110 is, for example, a probe card (a probe substrate), and is electrically connected to the terminals 11 of each of the plurality of LEDs 10 to be tested. The electrical connection unit 110 of the present embodiment also switches sets of the plurality of LEDs in the LED group placed on the placement unit 150 to which the electrical connection unit 110 connects and are to be sequentially tested, by the placement unit 150 moving with the LED group placed thereon. The electrical connection unit 110 of the present embodiment is arranged between the light source unit 120 and the plurality of LEDs 10, and has a substrate 111 and a plurality of probes 113.

The substrate 111 has an opening 112 that allows light from the light source unit 120 to pass towards the plurality of LEDs 10. In FIG. 1, the opening 112 is illustrated with dashed lines.

The plurality of probes 113 extends from the substrate 111 towards each of the plurality of LEDs 10 exposed in the opening 112 and contacts the terminals 11 of each of the plurality of LEDs 10. One end of each probe 113 opposite to the other end that contacts the terminals 11 is electrically connected to the electrical wire provided on the substrate 111. The plurality of electrical wires of the plurality of probes 113 extends from the peripheral surface of the substrate 111, and is electrically connected to the measuring unit 130.

It is noted that the plurality of probes 113 preferably has the same shape and dimension and the same distance from the corresponding LED 10 which they each contact, so that the receiving light quantity of each of the plurality of LEDs 10 are equal to each other. In addition, the plurality of probes 113 is preferably each plated or painted with color so that light do not diffusely reflect on the surface of the probes 113.

The light source unit 120 collectively irradiates the plurality of LEDs 10 with light. The light source unit 120 of the present embodiment is able to switch between plural types of light with different color components. The light source unit 120 of the present embodiment has a light source 121, a lens unit 123, a color filter 125, and a filter switching unit 124.

The light source 121 is a halogen lamp, for example, and emits white light that includes wavelengths of RGB equally. The lens unit 123 includes one or more lenses, and is provided adjacent to the irradiating unit of the light source 121 to convert the diffused light irradiated from the light source 121 to collimated light 122. In FIG. 1, the collimated light 122 is illustrated with diagonal lines. The projection of the collimated light 122 on the XY-plane covers at least the opening 112 in the substrate 111.

The color filter 125 may be any of the plural types of color filters 125, such as a red filter, a green filter, a blue filter, or the like, and absorbs light within a certain wavelength range included in the entering white light and transmits the remaining light. In the present embodiment, such a light source unit 120 having plural types of color filters 125 can pass light through each of the plural types of color filters 125 to thereby emit each of the plural types of light with different color components.

The filter switching unit 124 is provided adjacent to the lens unit 123 and has the plural types of color filters 125, and switches between the plural types of color filters 125 which the collimated light 122 from the lens unit 123 enters. It is noted that the filter switching unit 124 may switch the color filters 125 such that the collimated light 122 from the lens unit 123 does not enter any of the color filters 125. In such case, the plurality of LEDs 10 is directly irradiated with white light from the light source 121.

The measuring unit 130 measures the photoelectric signal which each of the plurality of LEDs 10 outputs via the electrical connection unit 110 after photoelectrically converting the light with which the light source unit 120 irradiates the plurality of LEDs 10. The measuring unit 130 of the present embodiment measures the photoelectric signal from the set of the plurality of LEDs 10 to which the electrical connection unit 110 is sequentially connected.

More particularly, the measuring unit 130 of the present embodiment is connected to electrical wire electrically connected to each probe 113 of the electrical connection unit 110, and measures the current value of the current output from the set of the plurality of LEDs 10, among the LED group placed on the placement unit 150, which has been switched to contact the plurality of probes 113. It is noted that, instead of the current value, the measuring unit 130 may measure a voltage value corresponding to the current value.

The control unit 140 controls each component of the test apparatus 100. The control unit 140 of the present embodiment controls the irradiation time, wavelength, and strength of the collimated light 122 to collectively irradiate the plurality of LEDs 10 by controlling the light source 121 and the filter switching unit 124 of the light source unit 120. The control unit 140 of the present embodiment also controls the switching of the set of the plurality of LEDs 10 to be sequentially tested among the LED group placed on the placement unit 150, by controlling the placement unit 150. More particularly, the control unit 140 drives the placement unit 150 such that the probe 113 contacts the terminal 11 of each LED 10 in the sets. It is noted that the control unit 140 may learn the spatial coordinate of the position of the plurality of probes 113 and the relative position of each of the plurality of probes 113 and the corresponding LED 10 on the placement unit 150 by referring to the reference data in the storage unit 145.

The control unit 140 further determines pass or fail of each of the plurality of LEDs 10 based on the measurement results by the measuring unit 130. The control unit 140 of the present embodiment determines at least one LED among the plurality of LEDs 10 as fail if the measured photoelectric signal of the at least one LED is outside a normal range. The control unit 140 performs sequential-control on these components by referring to the storage unit 145. It is noted that the control unit 140 functions as one example of the determination unit.

The storage unit 145 stores reference data to determine pass or fail of each of the plurality of LEDs 10, the determination results, reference data to move the placement unit 150, sequences or programs to control each component in the test apparatus 100, and the like. The storage unit 145 is referred to by the control unit 140.

The placement unit 150 has a substantially circular outline and the LED group is placed thereon. The placement unit 150 has a retention function such as a vacuum chuck or an electrostatic chuck, and retains the wafer 15 of the LED group placed thereon. In addition, the placement unit 150 is driven and controlled by the control unit 140 to thereby move in two dimensions along the XY-plane and to move up and down in the Z-axis direction. It is noted that in FIG. 1, illustration of the negative Z-axis direction side of the placement unit 150 is omitted. In addition, in FIG. 1, the direction of movement of the placement unit 150 is illustrated with an outlined arrow. The same applies to figures hereinafter.

The blocking unit 160 blocks light other than the light from the light source unit 120. The entire surface of the blocking unit 160 of the present embodiment is painted in black to prevent diffuse reflection of light on the surface. In addition, as shown in FIG. 1, the blocking unit 160 of the present embodiment is provided such that it is in close contact with each of the outer circumference of the light source 121 and the outer circumference of the substrate 111. Such configuration allows blocking of light other than the light from the light source unit 120.

Figure 2:
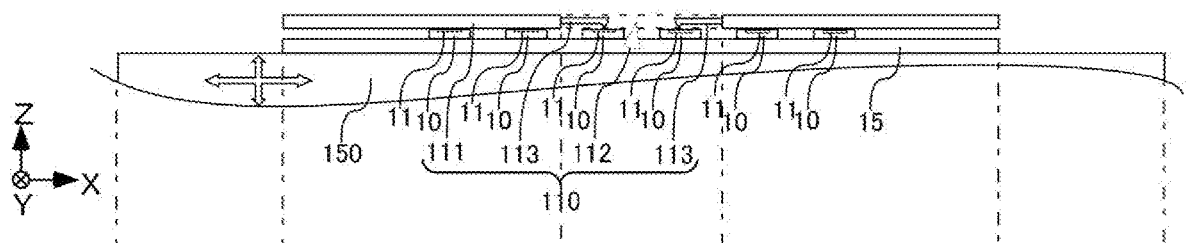
FIG. 2 is one example of a lateral view (A) and one example of a plan view (B) of a placement unit 150, a LED group placed thereon, and an electrical connection unit 110 with a plurality of probes 113 contacting certain sets of the plurality of LEDs 10 among the LED group.
Figure 2:
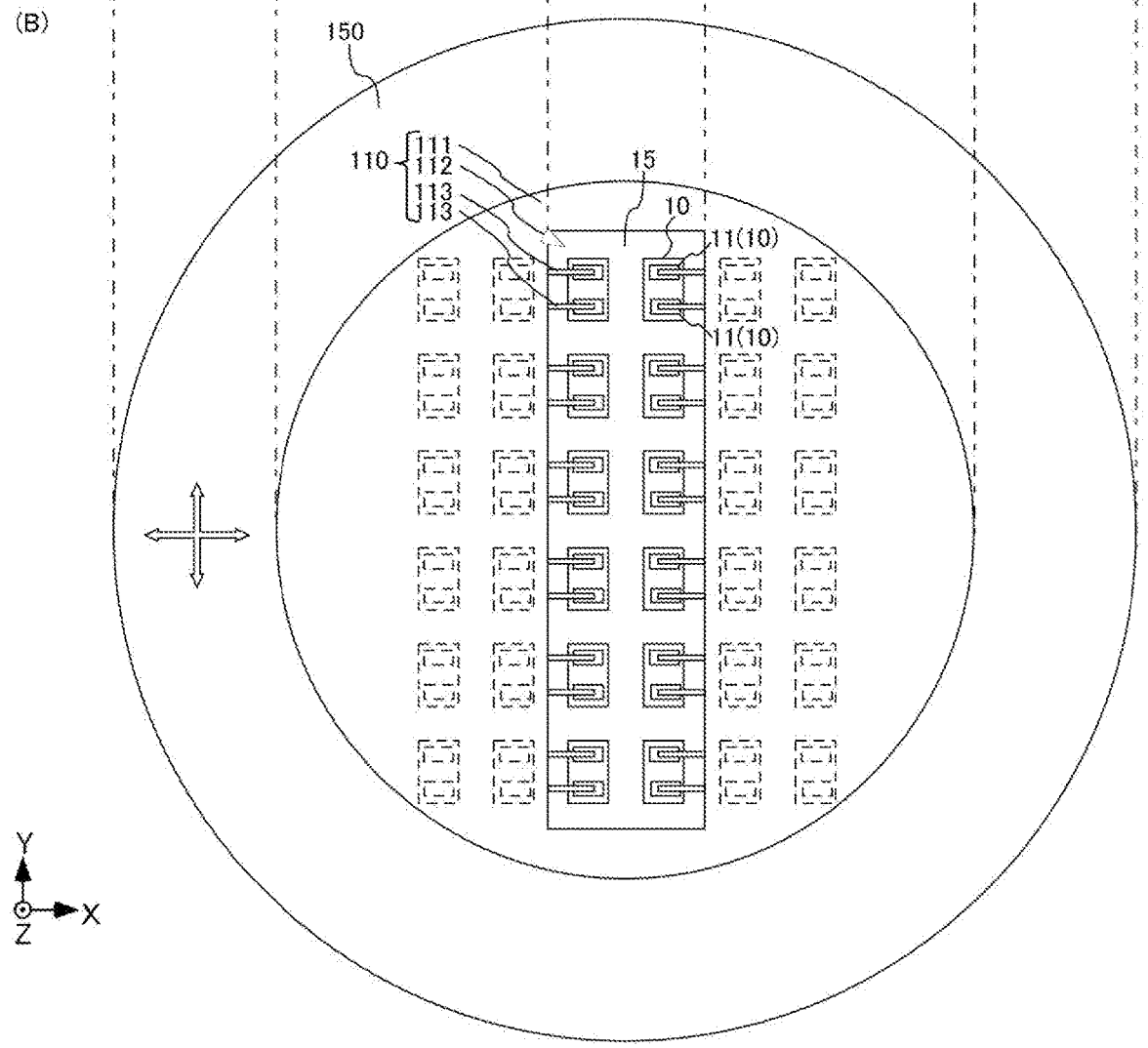

FIG. 2 is one example of a lateral view (A) and one example of a plan view (B) of a placement unit 150, a LED group placed thereon, and an electrical connection unit 110 with a plurality of probes 113 contacting a certain set of the plurality of LEDs 10 in the LED group. Diagram (A) of FIG. 2 extracts and illustrates only the placement unit 150, the LED group, and the electrical connection unit 110 shown in FIG. 1. In diagram (B) of FIG. 2, the plurality of LEDs 10, among the LED group on the placement unit 150, that are not visible due to the presence of the substrate 111 are illustrated with dashed lines.

As shown in diagram (B) of FIG. 2, two terminals 11 are formed in the Y-axis direction spaced apart from each other on each LED 10. In addition, the plurality of LEDs 10 is arranged in a matrix form and placed on the placement unit 150. In the illustrated example, it is arranged in a matrix form with six rows in the X-axis direction and six columns in the Y-axis direction.

The opening 112 in the substrate 111 has a rectangular contour elongated in the Y-axis direction. In the illustrated example, twelve LEDs 10, namely, two rows in the X-axis direction and six columns in the Y-axis direction, are exposed in the opening 112 as the set of the plurality of LEDs 10 to collectively measure the optical properties. One probe 113 of the electrical connection unit 110 is configured to be in contact with each of the plurality of terminals 11 located in the opening 112 in the substrate 111.

Figure 3:
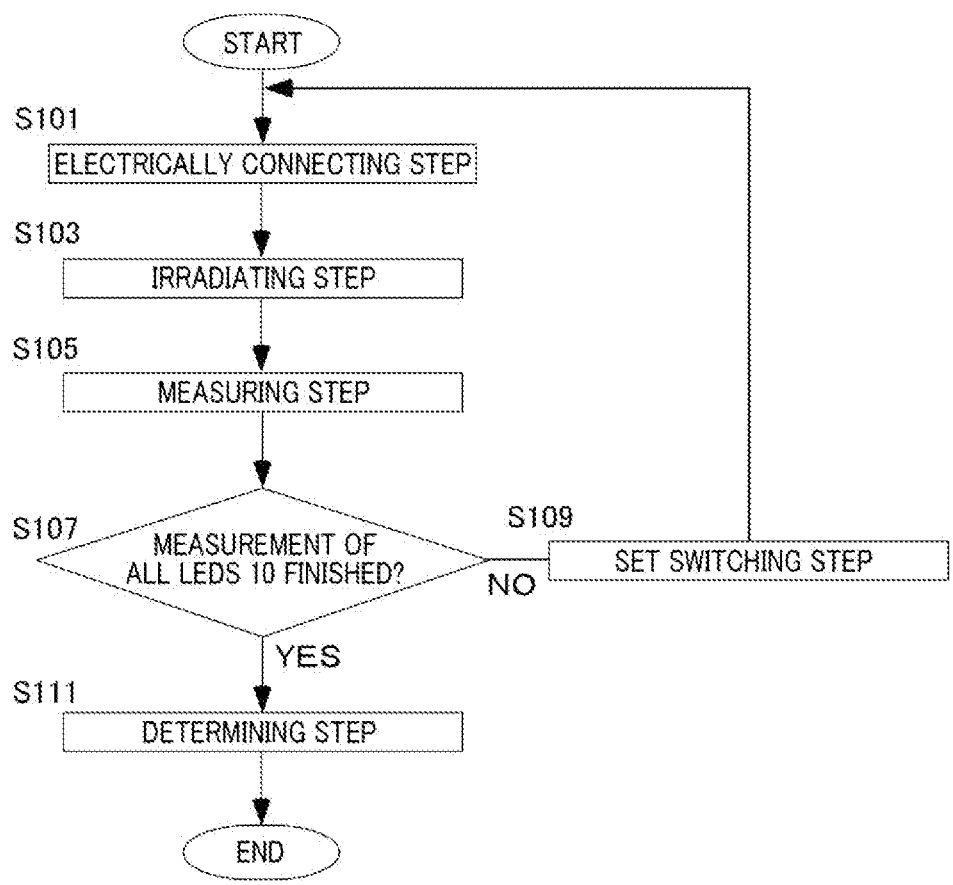
FIG. 3 is one example of a flow diagram describing the procedure of a test method performed by the test apparatus 100.

FIG. 3 is one example of a flow diagram describing the procedure of a test method performed by the test apparatus 100. The procedure starts with, for example, the user performing on the test apparatus 100 an input to start the testing of the LED group, with the LED group placed on the placement unit 150.

The test apparatus 100 executes a connecting step to electrically connect the electrical connection unit 110 to the terminals 11 of each of the plurality of LEDs 10 to be tested (Step S101). As a specific example, the control unit 140 outputs an instruction to the placement unit 150 to move the placement unit 150 such that the set of the plurality of LEDs 10 to be tested first in the LED group on the placement unit 150 is brought into contact with the plurality of probes 113.

The test apparatus 100 executes an irradiating step to collectively irradiate the plurality of LEDs 10 with light (Step S103). As a specific example, the control unit 140 outputs an instruction to the light source unit 120 to irradiate the set of the plurality of LEDs 10 exposed in the opening 112 with the collimated light 122, which is white light. Additionally, the control unit 140 may output an instruction to the light source unit 120 to cause the filter switching unit 124 of the light source unit 120 to switch the color filters 125 which the collimated light 122 from the lens unit 123 enters, and to thereby switch between plural types of light with different color components in turn and irradiate the plurality of LEDs 10.

The test apparatus 100 executes a measuring step of measuring a photoelectric signal that each of the plurality of LEDs 10 outputs via the electrical connection unit 110 after photoelectrically converting the irradiated light (Step S105). As a specific example, the control unit 140 outputs an instruction to cause the measuring unit 130 to measure the current value of the current output from the set of the plurality of LEDs 10, among the LED group placed on the placement unit 150, that is in contact with the plurality of probes 113 after the switching and to output the measurement results to the control unit 140. The control unit 140 stores each measurement result of the set of the plurality of LEDs 10 in the storage unit 145.

The test apparatus 100 decides whether the measurement of all LEDs 10 placed on the placement unit 150 has finished (Step S107), and if it is not finished (Step S107: NO), executes a set switching step to switch the sets of the plurality of LEDs 10 to be tested (Step S109) and returns to Step S101. As a specific example, the control unit 140 refers to the reference data in the storage unit 145 and decides whether the measurement results of all LEDs 10 placed on the placement unit 150 are stored therein, and if no, instructs the placement unit 150 to move the placement unit 150 so as to switch to the set of the plurality of LEDs 10 to be tested next.

In Step S107, if the measurements of all LEDs 10 placed on the placement unit 150 are finished (Step S107: YES), the test apparatus 100 executes the determining step to determine pass or fail of each of the plurality of LEDs 10 based on the measurement results from the above-mentioned measuring step (Step S111) and the procedure ends. As a specific example, the control unit 140 refers to the reference data in the storage unit 145 and if the measurement results of all LEDs 10 placed on the placement unit 150 are stored, determines the pass or fail of each of the plurality of LEDs 10 based on the measurement results.

The control unit 140 of the present embodiment determines among the plurality of LEDs 10 at least one LED 10 as fail if the measured photoelectric signal of the at least one LED 10 is outside a normal range. A range based on a statistic in accordance with the photoelectric signals output by the plurality of respective LEDs 10 may be used as one example of the normal range herein. More particularly, as one example of the normal range, a range within ±1σ of the mean value, a range within ±2σ of the mean value, or a range within ±3σ of the mean value of the values of the current output from the respective LEDs 10 on the placement unit 150 may be used. In this case, the control unit 140 calculates the mean value and the standard deviation σ based on the value of the current output from each of the plurality of LEDs 10 on the placement unit 150 stored in the storage unit 145.

Alternatively, a range based on a statistic in accordance with the photoelectric signals output by the LEDs 10 of different sets that are arranged at the same position in the measurement results from multiple measurements while changing among the LED group the sets of the plurality of LEDs 10 to be sequentially tested may be used as another example of the above-mentioned normal range. More particularly, as one example of the normal range, by setting, for example, the LED 10 in the LED group arranged in a matrix form, with six rows in the X-axis direction and six columns in the Y-axis direction on the placement unit 150 as shown in FIG. 2, that is arranged at a specific location as a target LED, a range within ±1σ of the mean value, a range within ±2σ of the mean value, or a range within ±3σ of the mean value of the values of the current output from the target LEDs in the respective LED groups on a plurality of placement units 150 may be used. In this case, the control unit 140 calculates the mean value and the standard deviation σ based on the values of the current output from the plurality of the target LEDs stored in the storage unit 145. Note that, in this case, the plurality of target LEDs in the respective LED groups are arranged at the same row and same column in the matrix form with six rows and six columns.

In addition, as another example of the above-mentioned normal range, a range determined by adding a margin defined based on the specification of the LEDs 10 to the criteria value defined based on the specification of the LEDs 10 may be used. In this case, the control unit 140 may refer to the information indicating the range previously stored in the storage unit 145.

As a comparative example relative to the test method according to the test apparatus 100 of the present embodiment, a test method of the optical properties of the LEDs, for example, by sequentially turning on the plurality of LEDs arranged on the wafer one by one, receiving the light by an image sensor, spectral luminance meter, or the like, and deciding whether they light up properly is contemplated.

When collectively measuring the optical properties of the above-mentioned plurality of LEDs using the test method of the comparative example, faulty LEDs having relatively deteriorating optical properties can not be accurately identified due to interference between light emitted from each of the plurality of LEDs adjacent to each other. In addition, image sensors and the like would become very costly in order to realize image recognition of a wide range with high accuracy. Especially, this problem becomes prominent when testing a plurality of micro LEDs.

On the contrary, according to the test apparatus 100 of the present embodiment, the electrical connection unit 110 is electrically connected to the terminals 11 of each of the plurality of LEDs 10 to be tested, the plurality of LEDs 10 are collectively irradiated with light, and each of the plurality of LEDs 10 photoelectrically converts the irradiated light to measure the photoelectric signal output via the electrical connection unit 110. According to the test apparatus 100, pass or fail of each of the plurality of LEDs 10 is further determined based on the measurement results of the plurality of LEDs 10. In this manner, the test apparatus 100 can not only reduce the processing time by simultaneously measuring the photoelectric signals of the plurality of LEDs 10, but also accurately identify faulty LEDs 10 having deteriorating optical properties by determining pass or fail of the LEDs 10 using the photoelectric signals that was measured without being affected by measurements of the optical properties of other LEDs 10. In addition, according to the test apparatus 100, the number of LEDs 10 measured simultaneously can be easily increased.

The LEDs 10 have different photoelectric effects depending on the combination of the wavelength of the irradiated light and the color of the LEDs 10. This property is such that, if the LEDs 10 are red, for example, the current amount becomes larger when irradiating the LEDs 10 with light having a red wavelength than when irradiating the LEDs 10 with light having a wavelength other than red. Since the test apparatus 100 of the present embodiment is able to switch between plural types of light with different color components as the light to collectively irradiate the plurality of LEDs 10, the property of the emitted color of each LED 10 can be inspected to determine pass or fail more accurately and in detail by adjusting the wavelength of the irradiating light.

For example, according to the test apparatus 100 of the present embodiment, measurement of the photoelectric signal output by irradiating the LEDs 10 having a red color with light having a red wavelength along with measurement of the photoelectric signal output by irradiating the LEDs 10 having a red color with white light enables not only comparative assessment of the LEDs 10 from a statistic obtained as a result of collectively irradiating the plurality of LEDs 10 with white light, but also, apart from the above-mentioned comparative assessment, comparative assessment of the LEDs 10 as a red color from a statistic obtained as a result of irradiating the plurality of LEDs 10 having a red color with light having a red wavelength.

In addition, in cases where there is incorrect information that the LEDs 10 are red while they are actually green, it can not be recognized that the LEDs 10 are green by merely irradiating the LEDs 10 with white light to measure its properties, whereas according to the test apparatus 100, such an error in the information can be recognized and accurately determined using the above-mentioned approach.

In addition, according to the test apparatus 100 of the present embodiment, the plurality of probes 113 and the substrate 111 used in the measurements of the optical properties of the plurality of LEDs 10 can be used in the measurement of electrical properties of the plurality of LEDs 10 as well, such as in VI tests using LED testers, for example. In addition, according to the test apparatus 100 of the present embodiment, other components than the light source unit 120 and the blocking unit 160, that is, the electrical connection unit 110, the measuring unit 130, the control unit 140, the storage unit 145, and the placement unit 150 can be substituted by those used in testing of devices other than optical devices such as the LED group.

In the embodiments above, the plurality of LEDs 10 has been described as being configured to have the terminals 11 on the light-emitting surface side. Alternatively, the plurality of LEDs 10 may have the terminals 11 on the side opposite to the light-emitting surface. The plurality of probes 113 may have different lengths depending on whether each terminal 11 of the plurality of LEDs 10 is located on the light-emitting surface side or the side opposite to the light-emitting surface.

In the configuration described in the embodiments above, the plurality of terminals 11 of the plurality of LEDs 10 is brought into contact with the plurality of probes 113 by moving the placement unit 150 up and down after moving the placement unit 150 on which the LED group is placed, in the XY-plane, such that the position coordinates of the plurality of probes 113 of the electrical connection unit 110 and the position coordinates of the plurality of LEDs 10 of the LED group match. Alternatively, the plurality of terminals 11 of the plurality of LEDs 10 may be brought into contact with the plurality of probes 113 by moving the substrate 111 up and down after the above-mentioned movement in the XY-plane.

In the embodiments above, the placement unit 150 has been described as having a substantially circular outline. Alternatively, when the LED group, which the plurality of LEDs 10 forms on a glass-based panel with a substantially rectangular outline having electrical wire formed thereon (PLP), for example, is placed on the placement unit 150, the placement unit 150 may have a substantially rectangular outline corresponding to the outline of the LED group.

Figure 4:
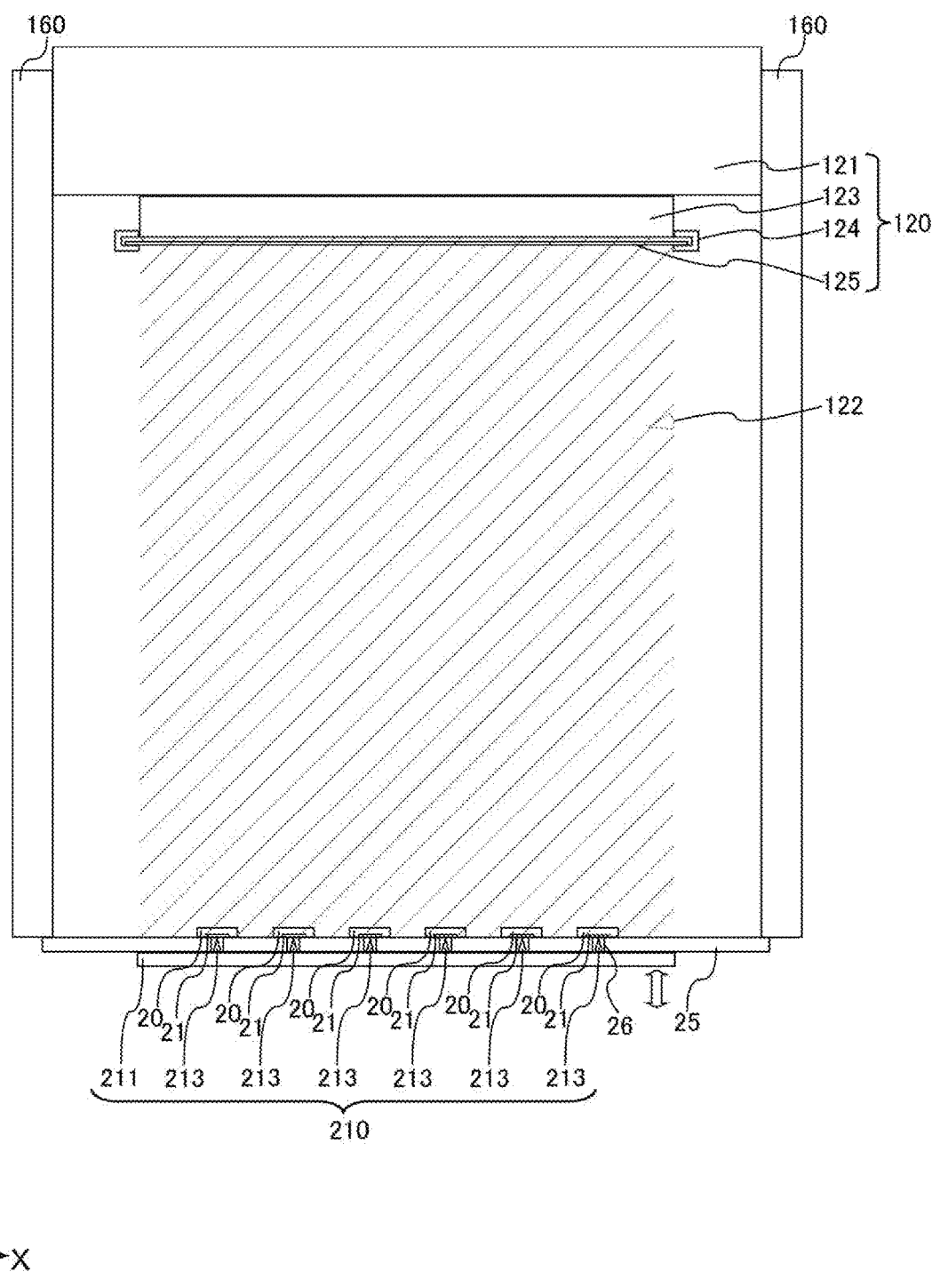
FIG. 4 is one example of a schematic overall view of a test apparatus 200 testing a plurality of LEDs 20.

FIG. 4 is one example of a schematic overall view of a test apparatus 200 testing a plurality of LEDs 20.

Figure 5:
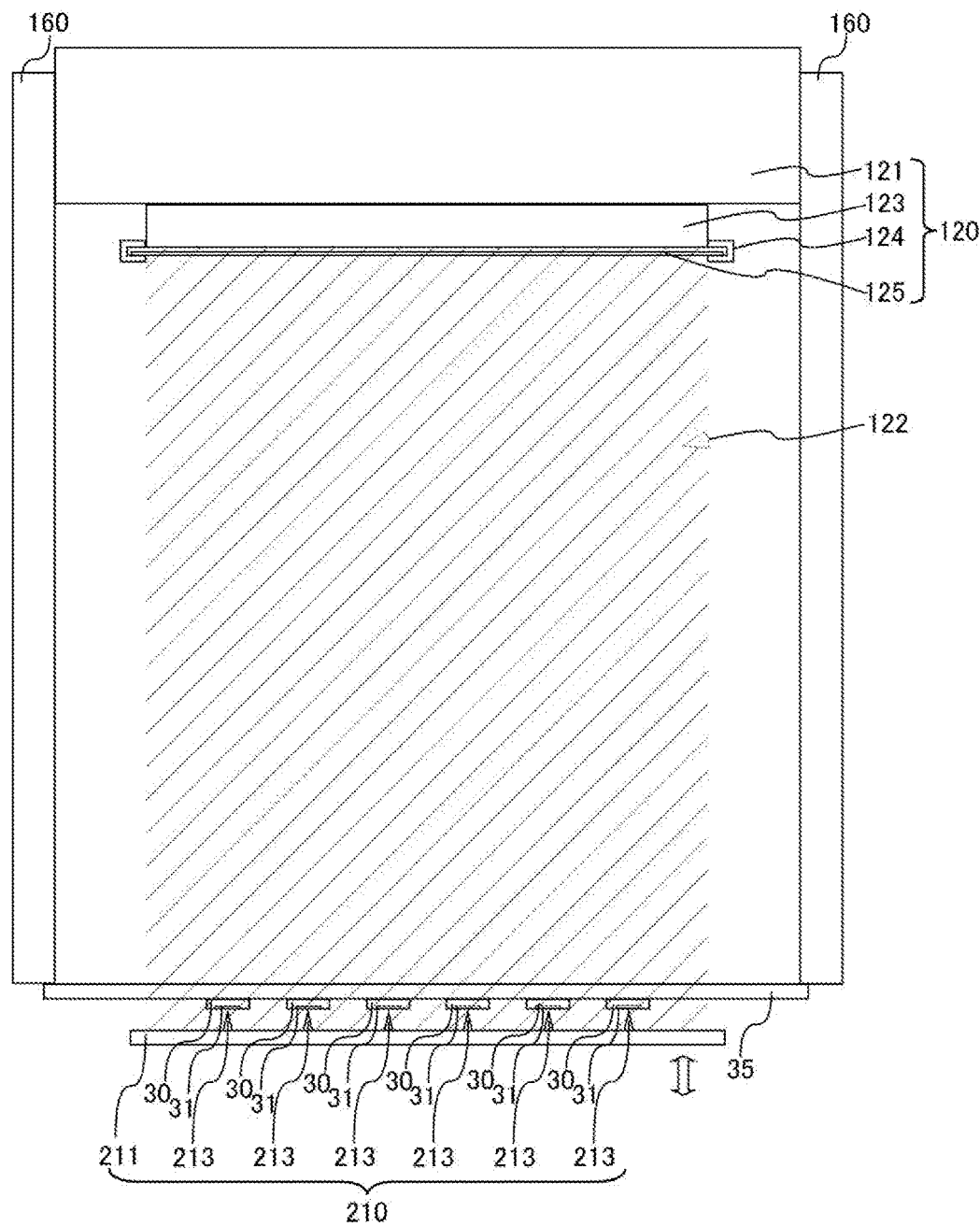
FIG. 5 is one example of a schematic overall view of a test apparatus 300 testing a plurality of LEDs 30.

In addition, FIG. 5 is one example of a schematic overall view of a test apparatus 300 testing a plurality of LEDs 30. In the description of embodiments shown in FIG. 4 and FIG. 5, the same components as those in the embodiments described using FIG. 1 to FIG. 3 are given the same reference numerals, and repeated descriptions are omitted. However, in each of FIG. 4 and FIG. 5, for the mere purpose of clarifying the description, illustration of the measuring unit 130, the control unit 140, the storage unit 145, and the placement unit 150 of the test apparatus 100 that has been described using FIG. 1 to FIG. 3 is omitted.

In the embodiments described using FIG. 1 to FIG. 3, the electrical connection unit 110 has been described as configured to be arranged between the light source unit 120 and the plurality of LEDs 10 and to have a substrate 111 and a plurality of probes 113 provided at the opening 112 in the substrate 111. Alternatively, in the embodiments shown in FIG. 4 and FIG. 5, an electrical connection unit 210 is arranged such that a plurality of LEDs 20, 30 are located between the light source unit 120 and the electrical connection unit 210, and has a substrate 211, and a plurality of probes 213 extending from the substrate 211 towards each of the plurality of LEDs 20, 30 and contacting the terminals 21, 31 of each of the plurality of LEDs 20, 30.

In the embodiment shown in FIG. 4, the LED group is a surface emitting type, where the light-emitting surface of the plurality of LEDs 20 does not face the wafer 25, and each terminal 21 of the plurality of LEDs 20 faces the wafer 25, and a plurality of vias 26 each extending in the Z-axis direction at the position of the corresponding terminal 21 are formed on the wafer 25. In such cases, the plurality of probes 213 of the electrical connection unit 210 may contact respective terminals 21 of the plurality of LEDs 20 from the negative Z-axis direction side of the wafer 25 through the plurality of vias 26 formed on the wafer 25.

In the embodiment shown in FIG. 5, the LED group is a back emission type, where the light-emitting surface of each of the plurality of LEDs 30 faces the wafer 35 which transmits light, and each terminal 31 of the plurality of LEDs 30 does not face the wafer 35. In such cases, the electrical connection unit 210 may bring the plurality of probes 213 into contact with each terminal 31 of the plurality of LEDs 30 from the negative Z-axis direction side of the wafer 35.

In the electrical connection unit 210 of the embodiments shown in FIG. 4 and FIG. 5, the substrate 211 may not have an opening 112 in the electrical connection unit 110 in the embodiments described using FIG. 1 to FIG. 3, and the plurality of probes 213 may not extend in the XY-plane. As shown in FIG. 4 and FIG. 5, the plurality of probes 213 may extend towards the terminals 21, 31 of LEDs 20, 30 in the Z-axis direction, such that they form the shape of a @pin support@ along with the substrate 211.

The test apparatuses 200, 300 of the embodiments shown in FIG. 4 and FIG. 5 have similar effects as the test apparatus 100 of the embodiments described using FIG. 1 to FIG. 3. In addition, by including in the test apparatuses 200, 300 the electrical connection unit 210 having a configuration in which the plurality of probes 213 extends from one surface of the substrate 211 without openings towards the terminals 21, 31 of LEDs 20, 30 in the Z-axis direction, the number of probes 213 can be increased and the number of LEDs 20, 30 to be measured simultaneously can be increased, compared to when using the electrical connection unit 110 having the plurality of probes 113 extending towards the terminals 11 of the LEDs 10 exposed in the opening 112 in the substrate 111, according to the embodiments described using FIG. 1 to FIG. 3.

It is noted that in the embodiment shown in FIG. 4 and FIG. 5, the plurality of terminals 21, 31 of the plurality of LEDs 20, 30 may be brought into contact with the plurality of probes 213 by moving the substrate 211 of the electrical connection unit 210 up and down as illustrated with outlined arrows in each figure after the placement unit 150 having the LED group placed thereon is moved in the XY-plane such that the position coordinates of the plurality of probes 113 of the electrical connection unit 110 and the position coordinates of the plurality of LEDs 10 of the LED group match. In addition, in the embodiment shown in FIG. 5, the placement unit is preferably configured not to contact the plurality of LEDs 30 so as not to break the plurality of LEDs 30 formed on the wafer 35.

In addition, in the embodiments shown in FIG. 4 and FIG. 5, the configuration illustrated in each of FIG. 4 and FIG. 5 may be inverted in the Z-axis direction and may be configured to irradiate the plurality of LEDs 20, 30 with the collimated light 122 from the light source unit 120 from the negative Z-axis direction.

In addition, in the embodiments shown in FIG. 4 and FIG. 5, a support board, for example a glass, that transmits light may be interposed between the wafers 25, 35 and the blocking unit 160 in order to prevent deformation of the wafers 25, 35 due to pressing by the plurality of probes 213 of the electrical connection unit 210. If the plurality of LEDs 20 are located facing the light source unit 120 such as in the embodiment shown in FIG. 4, the support board is preferably configured not to contact the plurality of LEDs 20 so as not to break the plurality of LEDs 20 formed on the wafers 25.

In a plurality of embodiments above, the light source unit 120 has been described as being configured to be able to switch between plural types of light with different color components by having a light source 121 emitting white light, plural types of color filters 125 with different color components, and a filter switching unit 124 to switch between the plural types of color filters 125 which the collimated light 122 from the lens unit 123 enters. Alternatively, the light source unit 120 has a plurality of light sources with different optical wavelengths, such as a full wavelength of visible light, a red wavelength, a green wavelength, a blue wavelength, for example, and may emit plural types of light with different color components, for example, white, red, green, blue or the like by switching between the plurality of light sources or by combining the plurality of light sources.

In a plurality of embodiments above, if the LED group is configured with the plurality of LEDs formed on a glass-based panel (PLP) with a substantially rectangular outline having electrical wire formed thereon, the electrical connection unit may be configured to cause the probe to contact each wire in the column direction and the row direction arranged on two sides of the panel.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc.

More specific examples of computer-readable media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

Figure 6:
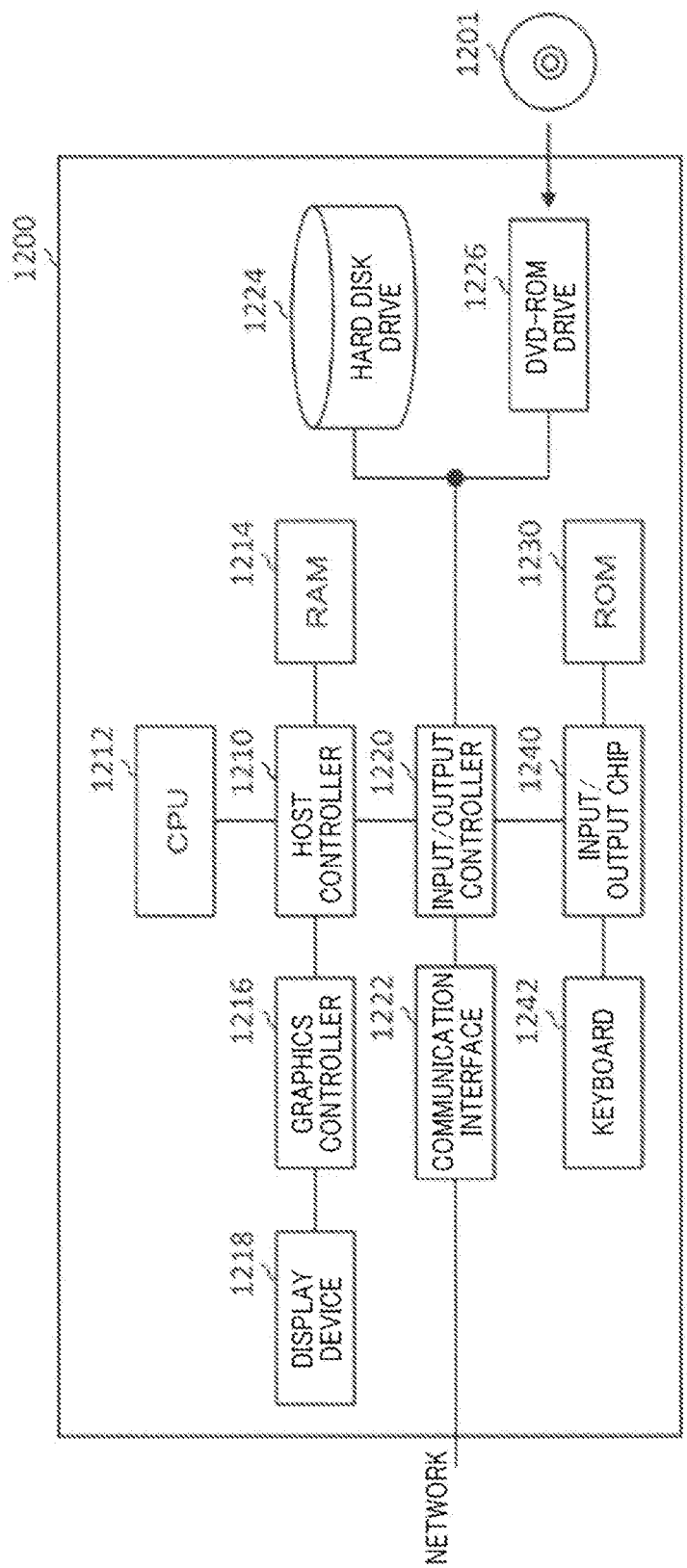
FIG. 6 is a view showing an example of a computer 1200 which can realize a plurality of aspects of the present invention entirely or partially.

FIG. 6 shows an example of a computer 1200 which can realize a plurality of aspects of the present invention entirely or partially. A program installed on the computer 1200 can cause the computer 1200 to function as an operation associated with an apparatus according to embodiments of the present invention or as one or more "unit(s)" of the apparatus, or to perform the operation or the one or more "unit(s)", and/or can cause the computer 1200 to perform processes according to embodiments of the present invention or steps of the processes. Such a program may be executed by a CPU 1212 to cause the computer 1200 to perform particular operations associated with some or all blocks in the flowcharts or block diagrams described herein.

The computer 1200 according to the present embodiment includes a CPU 1212, a RAM 1214, a graphics controller 1216 and a display device 1218, which are connected to each other by a host controller 1210. The computer 1200 also includes a communication interface 1222, a hard disk drive 1224, DVD-ROM drive 1226, and an input/output unit such as an IC card drive, which are connected to the host controller 1210 via the input/output controller 1220. The computer also includes legacy input/output units such as a ROM 1230 and a keyboard 1242, which are connected to the input/output controller 1220 via an input/output chip 1240.

The CPU 1212 operates in accordance with programs stored in the ROM 1230 and the RAM 1214, and controls each unit accordingly. The graphics controller 1216 acquires image data generated by the CPU 1212 on a frame buffer or the like provided in the RAM 1214 or in the graphics controller 1216 itself, and displays the image data on the display device 1218.

The communication interface 1222 communicates with other electronic devices via a network. The hard disk drive 1224 stores programs and data to be used by the CPU 1212 in the computer 1200. The DVD-ROM drive 1226 reads programs or data from the DVD-ROM 1201, and provides the programs or data to the hard disk drive 1224 via the RAM 1214. The IC card drive reads programs and data from an IC card, and/or writes programs and data into the IC card.

The ROM 1230 has stored therein a boot program or the like to be executed by the computer 1200 at the time of activation, and/or a program that depends on the hardware of the computer 1200. The input/output chip 1240 may also connect various input/output units to the input/output controller 1220 via a parallel port, a serial port, a keyboard port, a mouse port or the like.

Programs are provided by a computer-readable storage medium such as the DVD-ROM 1201 or an IC card. The programs are read from the computer-readable storage medium, installed on the hard disk drive 1224, the RAM 1214 or the ROM 1230, which are also examples of a computer-readable storage medium, and executed by the CPU 1212. The information processing described in these programs is read into the computer 1200, resulting in cooperation between a program and the above-mentioned various types of hardware resources. An apparatus or method may be constituted by realizing the operation or processing of information in accordance with the usage of the computer 1200.

For example, if communication is performed between the computer 1200 and an external device, the CPU 1212 may execute the communication program loaded on the RAM 1214 and instruct the communication interface 1222 to process the communication based on the processing described in the communication program. The communication interface 1222 reads the transmission data stored in the transmission buffer region provided in a recording medium such as the RAM 1214, the hard disk drive 1224, the DVD-ROM 1201, or the IC card under control of the CPU 1212, transmits the transmission data read to the network, or writes the reception data received from the network onto the reception buffer region or the like provided on the recording medium.

The CPU 1212 may also make all or required portions of the files or databases stored in an external recording medium such as the hard disk drive 1224, the DVD-ROM drive 1226 (DVD-ROM 1201) or an IC card to be read by the RAM 1214, and perform various types of processing on the data on the RAM 1214. The CPU 1212 may then write back the processed data to the external recording medium.

Various types of information such as various types of programs, data, tables and databases may be stored in the recording medium for processing of information. The CPU 1212 may perform various types of processing on the data read from the RAM 1214, which includes various types of operations, processing of information, condition judging, conditional branch, unconditional branch, search/replace of information, etc., as described throughout this disclosure and designated by an instruction sequence of programs, and writes the result back to the RAM 1214. In addition, the CPU 1212 may search for information in a file, a database, etc., in the recording medium. For example, when a plurality of entries, each having an attribute value of a first attribute associated with an attribute value of a second attribute, are stored in the recording medium, the CPU 1212 may search the plurality of entries for an entry whose attribute value of the first attribute matches a designated condition, read the attribute value of the second attribute stored in the entry, and thereby acquire the attribute value of the second attribute associated with the first attribute that meets a predetermined condition.

The programs or software modules in the above description may be stored on the computer 1200 or a computer-readable storage medium near the computer 1200. Further, a recording medium such as a hard disk or a RAM provided in a server system connected to a dedicated communication network or the Internet can be used as a computer-readable storage media, which provides programs to the computer 1200 via the network.

While the embodiments of the present invention have been described, the technical scope of the invention is not limited to the above described embodiments. It is apparent to persons skilled in the art that various alterations and improvements can be added to the above-described embodiments. Also, unless a technical contradiction occurs, the matters described in a specific embodiment can be applied to other embodiments. Also, each component may have similar features to another component having the same name and a different reference numeral. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10, 20, 30 LED, 11, 21, 31 terminal, 15, 25, 35, wafer, 100, 200, 300 test apparatus, 110, 210 electrical connection unit, 111, 211 substrate, 112 opening, 113, 213 probe, 120 light source unit, 121 light source, 122 collimated light, 123 lens unit, 124 filter switching unit, 125 color filter, 130 measuring unit, 140 control unit, 145 storage unit, 150 placement unit, 160 blocking unit, 1200 computer, 1201 DVD-ROM, 1210 host controller, 1212 CPU, 1214 RAM, 1216 graphic controller, 1218 display device, 1220 input/output controller, 1222 communication interface, 1224 hard disk drive, 1226 DVD-ROM drive, 1230 ROM, 1240 input/output chip, 1242 keyboards

What is claimed is:

1. A test apparatus comprising:
   an electrical connection unit electrically connected to respective terminals of a plurality of LEDs to be tested;
   a light source unit which collectively irradiates the plurality of LEDs with collimated and continuous light;
   a measuring unit which is electrically connected to the electrical connection unit, and measures a photoelectric signal that each of the plurality of LEDs outputs via the electrical connection unit after photoelectrically converting the light with which the light source unit irradiates the plurality of LEDs; and
   a determination unit which determines pass or fail of each of the plurality of LEDs based on the measurement results by the measuring unit.

2. The test apparatus according to claim 1, wherein the electrical connection unit is arranged such that the plurality of LEDs are located between the light source unit and the electrical connection unit, and includes:

a substrate; and a plurality of probes extending from the substrate towards each of the plurality of LEDs and contacting the terminals of each of the plurality of LEDs.

3. The test apparatus according to claim 1, wherein the determination unit determines among the plurality of LEDs at least one LED as fail if the measured photoelectric signal of the at least one LED is outside a normal range.

4. The test apparatus according to claim 1,
wherein
the determination unit determines among the plurality of LEDs at least one LED as fail if the measured photoelectric signal of the at least one LED is outside a normal range, and
a range based on a statistic in accordance with the photoelectric signals output by the plurality of respective LEDs is used as the normal range.

5. The test apparatus according to claim 1, wherein the light source unit
includes a plurality of light sources with different optical wavelengths, and
emits plural types of light with different color components by switching between the plurality of light sources or by combining the plurality of light sources.

6. The test apparatus according to claim 1, further comprising:
a blocking unit which blocks light other than the light from the light source unit.

7. A test apparatus comprising:
an electrical connection unit electrically connected to respective terminals of a plurality of LEDs to be tested;
a light source unit which collectively irradiates the plurality of LEDs with light;
a measuring unit which is electrically connected to the electrical connection unit, and measures a photoelectric signal that each of the plurality of LEDs outputs via the electrical connection unit after photoelectrically converting the light with which the light source unit irradiates the plurality of LEDs;
a determination unit which determines pass or fail of each of the plurality of LEDs based on the measurement results by the measuring unit; and
a placement unit on which a LED group is placed,
wherein the electrical connection unit switches sets of the plurality of LEDs in the LED group to which the electrical connection unit connects and are to be sequentially tested, by the placement unit moving with the LED group placed thereon, and
the measuring unit measures the photoelectric signal from the set of the plurality of LEDs to which the electrical connection unit is sequentially connected.

8. The test apparatus according to claim 7, wherein the electrical connection unit is arranged between the light source unit and the plurality of LEDs, and includes:
a substrate having an opening which allows the light from the light source unit to pass towards the plurality of LEDs; and
a plurality of probes extending from the substrate towards each of the plurality of LEDs exposed in the opening and contacting the terminals of each of the plurality of LEDs.

9. A test apparatus comprising:
an electrical connection unit electrically connected to respective terminals of a plurality of LEDs to be tested;
a light source unit which collectively irradiates the plurality of LEDs with light;
a measuring unit which is electrically connected to the electrical connection unit, and measures a photoelectric signal that each of the plurality of LEDs outputs via the electrical connection unit after photoelectrically converting the light with which the light source unit irradiates the plurality of LEDs; and
a determination unit which determines pass or fail of each of the plurality of LEDs based on the measurement results by the measuring unit, wherein
the determination unit determines among the plurality of LEDs at least one LED as fail if the measured photoelectric signal of the at least one LED is outside a normal range, and
a range based on a statistic in accordance with the photoelectric signals output by LEDs of different sets that are arranged at a same position in measurement results from multiple measurements while changing the set of the plurality of LEDs to be sequentially tested among the LED group is used as the normal range.

10. A test apparatus comprising:
an electrical connection unit electrically connected to respective terminals of a plurality of LEDs to be tested;
a light source unit which collectively irradiates the plurality of LEDs with light;
a measuring unit which is electrically connected to the electrical connection unit, and measures a photoelectric signal that each of the plurality of LEDs outputs via the electrical connection unit after photoelectrically converting the light with which the light source unit irradiates the plurality of LEDs; and
a determination unit which determines pass or fail of each of the plurality of LEDs based on the measurement results by the measuring unit, wherein
the light source unit is able to switch between plural types of light with different color components.

11. The test apparatus according to claim 10, wherein the light source unit emits white light.

12. The test apparatus according to claim 10, wherein the light source unit includes plural types of color filters, and allows light to pass through each of the plural types of color filters to thereby emit each of the plural types of light.

13. A test method comprising:
electrically connecting an electrical connection unit to respective terminals of a plurality of LEDs to be tested;
collectively irradiating the plurality of LEDs with collimated and continuous light;
measuring, by a measuring unit which is electrically connected to the electrical connection unit, a photoelectric signal that each of the plurality of LEDs outputs via the electrical connection unit after photoelectrically converting the irradiated light; and
determining pass or fail of each of the plurality of LEDs based on the measurement results from the measuring.

14. A non-transitory computer-readable medium having recorded thereon a program that, when executed by a test apparatus to test a plurality of LEDs, causes the test apparatus to execute a test method comprising:
electrically connecting an electrical connection unit to respective terminals of a plurality of LEDs to be tested;
collectively irradiating the plurality of LEDs with collimated and continuous light;
measuring, by a measuring unit which is electrically connected to the electrical connection unit, a photoelectric signal that each of the plurality of LEDs outputs via the electrical connection unit after photoelectrically converting the irradiated light; and determining pass or fail of each of the plurality of LEDs based on the measurement results from the measuring.

* * * * *